United States Patent
Mautz et al.

(10) Patent No.: US 6,892,108 B2
(45) Date of Patent: May 10, 2005

(54) METHOD FOR ADJUSTING PROCESSING PARAMETERS OF AT LEAST ONE PLATE-SHAPED OBJECT IN A PROCESSING TOOL

(75) Inventors: Karl Mautz, Austin, TX (US); Sebastian Schmidt, Dresden (DE); Thorsten Schedel, Dresden (DE)

(73) Assignees: Infineon Technologies SC300 GmbH & Co. KG, Dresden (DE); Infineon Technologies AG, Munich (DE); Motorola Inc., Schaumburg, IL (US)

( * ) Notice: Subject to any disclaimer, the term of this patent is extended or adjusted under 35 U.S.C. 154(b) by 6 days.

(21) Appl. No.: 10/694,594

(22) Filed: Oct. 27, 2003

(65) Prior Publication Data

US 2004/0125191 A1 Jul. 1, 2004

Related U.S. Application Data

(63) Continuation of application No. PCT/EP02/04539, filed on Apr. 24, 2002.

(30) Foreign Application Priority Data

Apr. 27, 2001 (EP) ............................................. 01110455

(51) Int. Cl.[7] .............................................. G06F 19/00
(52) U.S. Cl. ...................................... 700/108; 702/182
(58) Field of Search ........................ 700/108–111, 121; 700/117; 702/182–184

(56) References Cited

U.S. PATENT DOCUMENTS

| | | | |
|---|---|---|---|
| 3,751,647 A | 8/1973 | Maeder et al. | |
| 5,086,397 A | 2/1992 | Schuster et al. | |
| 5,392,361 A | 2/1995 | Imaizumi et al. | |
| 5,497,331 A | 3/1996 | Iriki et al. | |
| 6,587,744 B1 * | 7/2003 | Stoddard et al. | ............ 700/121 |
| 6,643,017 B2 * | 11/2003 | Cohen et al. | ............... 356/328 |
| 6,785,586 B1 * | 8/2004 | Toprac et al. | ............... 700/175 |
| 2002/0147518 A1 * | 10/2002 | Nguyen | ...................... 700/108 |
| 2002/0171828 A1 * | 11/2002 | Cohen et al. | ............... 356/328 |

FOREIGN PATENT DOCUMENTS

| | | |
|---|---|---|
| EP | 0 514 104 A2 | 11/1992 |
| EP | 0 609 999 A1 | 8/1994 |
| JP | 04277802 A | 10/1992 |
| WO | 00/79355 A1 | 12/2000 |

* cited by examiner

*Primary Examiner*—Albert W. Paladini
*Assistant Examiner*—Zoila Cabrera
(74) *Attorney, Agent, or Firm*—Laurence A. Greenberg; Werner H. Stemer; Ralph E. Locher

(57) ABSTRACT

Processing parameters of at least one plate-shaped object, e.g. a semiconductor device or wafer, or a flat panel display, in a processing tool are adjusted depending on which processing device out of at least one set of processing devices has been used for the semiconductor device in a preceding step. A virtual or physical tag is generated, which connects the semiconductor device identification with the processing device identification. This enables a compensation of tool-dependent effects in previous processing of a single device. An example is chemical mechanical polishing prior to lithography, where alignment marks can be deteriorated differently between CMP-units. The amount of compensation is detected and evaluated by metrology tools, which—depending on the sequence of the metrology step relative to the processing step to be adjusted—either feed-forward or feed-backward their results to the processing tool. The yield of semiconductor device production is advantageously increased.

9 Claims, 3 Drawing Sheets

METHOD FOR ADJUSTING PROCESSING PARAMETERS OF AT LEAST ONE PLATE-SHAPED OBJECT IN A PROCESSING TOOL

CROSS-REFERENCE TO RELATED APPLICATION

This application is a continuation of copending International Application No. PCT/EP02/04539, filed Apr. 24, 2002, which designated the United States and was published in English.

BACKGROUND OF THE INVENTION

Field of the Invention

The present invention relates to a method for adjusting processing parameters of at least one plate-shaped object in a processing tool. The plate-shaped object having experienced at least one preceding processing step performed by one processing device out of at least one set of processing devices. An adjustment in the processing tool being controlled by a control unit.

In semiconductor device or flat panel display manufacturing, minimum structure sizes are intended to shrink continuously in order to achieve high densities of patterns and structures in integrated devices.

Currently, lithography for structuring such patterns becomes increasingly challenging when extending to minimum structure sizes equal to or lower than 0.25 $\mu$m technologies. Strong requirements concerning critical dimension, overlay or alignment, etc., are to be fulfilled.

While limitations on minimum structure sizes can easily be investigated and derived from the lithography part of the semiconductor device manufacturing sequence of steps, such challenging limitations may also be inferred from other semiconductor device processing steps, in particular those preceding the lithography step. For example, in the case of semiconductor wafers, the step of chemical-mechanical polishing (CMP) is known to affect the structure of alignment marks either by obscuration of such marks or by producing inclined and offset, i.e. shifted, alignment profiles. Therefore, the abrading effect directly influences the alignment step prior to exposing the following resist layer.

Thus, since previous processing becomes increasingly important for the current step adjustment, methods have evolved to statistically increase the yield for the production of semiconductor devices. For example, the manufacturing semiconductor wafers are combined into lots, the semiconductor wafers are provided to a processing tool, i.e. the lithography tool in this example, and are exposed and processed with a set of processing parameters such as alignment shifts and scales, exposure dose, or focus channel. The outcome of the process is controlled in an overlay tool that provides a feedback of the process quality to the lithography tool or its control unit, respectively. If the metrology results fail some specification, a new lithography run is done with new test wafers. To accomplish this, the metrology parameters like overlay, critical dimension, etc., are recalculated or reinterpreted by the control unit in terms of e.g. exposure parameter adjustments. The adjustments performed on the test wafers are then verified to be successful one more time using the overlay tool. Using the feedback cycle, production wafers eventually pass the metrology measurement in order to be further processed.

The measurement results and the process parameter settings are typically stored in a database for providing a calculation of those optimal parameter settings, which provide the highest yield of wafers.

This method, although providing a closed-loop control circuit, unfortunately comes together with several disadvantages. Time is spent by processing a number of test wafers in order to retrieve a production wafer, lithography tool capacity is reduced, test wafer material is consumed nonproductively, and the time to produce a wafer is prolonged. In particular, the scatter in overlay measurement data of wafers in a lot statistically is still considerably resulting in a reduced yield.

SUMMARY OF THE INVENTION

It is accordingly an object of the invention to provide a method for adjusting processing parameters of at least one plate-shaped object in a processing tool that overcomes the above-mentioned disadvantages of the prior art methods of this general type, which reduces the amount of rework in manufacturing plate-shaped objects, e.g. semiconductor devices or flat panel displays, thereby improving the quality, and saving time and costs to produce a plate-like object.

The objective is solved by a method for adjusting processing parameters of at least one plate-shaped object in a processing tool. The plate-shaped object previously experienced at least one preceding processing step performed by one processing device out of at least one set of processing devices. An adjustment in the processing tool is controlled by a control unit. The method includes providing a plate-shaped object to the processing device, processing the plate-shaped object, generating a tag associated with the plate-shaped object, representing the processing device that has been used in the preceding processing step, transferring the tag to the control unit, transferring the plate-shaped object to the processing tool, adjusting the process parameters of the processing tool using the control unit in dependence of the processing device being associated with the tag, performing the process step on the plate-shaped object in the processing tool using the adjusted process parameters.

The term plate-shaped object used in this document refers to devices containing a substrate for receiving a structure on its surface in a sequence of processing steps involving critical variables (i.e. processing parameters), in particular semiconductor wafers, masks or reticles, compact discs, or flat panel displays. The following description of the invention concentrates on the case of semiconductor devices, but is also valid for other embodiments of plate-shaped objects as stated above.

The term processing tool refers to the manufacturing apparatus or configuration, where according to the present method the processing parameters are to be adjusted. Processing device refers to the apparatus or configuration, which performed the preceding step in the sequence of steps for manufacturing the plate-shaped object. A step is defined as a physical or chemical process applied to the plate-shaped object, which changes a physical or chemical characteristic on or in it.

It is found that the statistical scatter in the overlay, critical dimension, layer thickness and other metrology data resulting from poorly chosen processing parameters in e.g. the lithography tool or other processing tools has one of its origins in the variation within groups of similar processing devices, which perform preceding processing steps prior to the processing tool under consideration. The differing processing conditions inside these devices generally vary from processing device supplier to supplier, but even vary within groups of processing devices of the same type.

Because e.g. the variations between the processing devices depend on conditions inferred most probably from the time of their construction, or system maintenance setups, these variations are reflected by parameter offsets that are constant for a time.

According to the method of the present invention, the semiconductor devices, e.g. wafers, which are commonly distributed over a set of processing devices performing the same tasks preceding the step currently under consideration, are each supplied with a tag. The tag stores data regarding the wafer identification and the processing device that has been used in the preceding step. The wafer identification is necessary in order to regain the information for the current process step under consideration of which processing device had been used in the preceding step. Typically, an identification is not physically marked on the semiconductor device or wafer surface. Rather, the name of the device carrier, which is used to transport devices through the fab, and the slot number enable a re-identification of an individual wafer. Therefore, the tags considered in the present method are preferably embodied as data signals exchanged between local hosts of the processing tools or devices via a fabrication-wide CIM-system.

Another possibility would be to supply the corresponding information put into tags with the device carrier box, which can be read out locally at the processing tool under consideration.

It is also possible to regroup or reorder the semiconductor devices process in a preceding step according to the processing device used. By the slot number of the corresponding device in the device carrier, it is then known which processing device had been active to process the corresponding semiconductor device or wafer inside the slot. In this case, the slot number gives the wafer identification and a corresponding tag can be generated.

A main advantage of the present invention is, that the processing parameters of the corresponding processing tool under investigation can be adjusted for compensating the individual variations of the processing devices which affect characteristics of the semiconductor devices which are used to perform the current processing step. In the example of chemical-mechanical polishing of semiconductor wafers in a preceding step, an alignment mark that is constantly offset in one of the CMP-apparatus, by identification of the semiconductor wafer the tag is analyzed to give the identification of the processing device of the preceding CMP-step, and a control unit controlling the current lithographic processing tool can apply a compensating adjustment of the corresponding alignment parameters, if the constant offset of the CMP-apparatus is known.

Preferably, these data are stored in a database connected to the control unit. The adjustment advantageously leads to a reduction of statistical scatter of metrology measurements of samples of semiconductor wafers or other devices such as flat panel displays. Moreover, since these variation effects can be compensated, tedious system maintenance of, e.g., the CMP-unit in order to eliminate the error or offset is now obsolete.

Therefore, the semiconductor device processing yield is advantageously increased and the waste of processing test wafers can effectively be reduced.

In single-wafer-tracking, or single-device-tracking, respectively, each wafer is processed with its own tag. Since each tag may reflect differing processing being used in a preceding step for the current wafer, the processing tool, e.g. the lithography tool, can have different adjustments of processing parameters from wafer to wafer. Because the tag may be forwarded automatically and the control unit can analyze the tag immediately, no operator efforts are necessary to control the processing tool adjustment for individual wafers or other semiconductor devices.

In a further aspect, the processing devices of the preceding step are considered to be at least one of chemical-mechanical polishing (CMP), etching or chemical vapor disposition (CVD).

Also, the processing tool in the case of semiconductor wafers, needs not to be restricted to lithography tools. For example, it can be an etching tool while the preceding step preparing the etching is a developing step performed in a lithography cluster, etc.

Two further aspects consider different mechanisms of feeding quality measurements results to the control unit that needs to know how to adjust a processing parameter for a semiconductor device with a known preceding processing device due to the tag. In both aspects, the quality measurements are taken by metrology tools. In the first aspect, a corresponding metrology step is performed after the preceding processing step in a processing device but prior to the current processing step under consideration to be performed by the processing tool, e.g. an etching tool preceded by a developing step. An individual processing device parameter offset can be recognized by the metrology tool and the result for the corresponding semiconductor device, or wafer, be feed-forwarded to the control unit. The control unit receives the tag of the wafer, identifies the processing device that has been used, and compares the measurement results with targets. This comparison then is converted into a new processing parameter adjustment for the wafer.

The control unit also may accumulate the data of wafers that recently have been processed on the same processing device as that of the current wafer. Such a method increases the statistical basis for establishing compensating adjustments.

While in the first aspect, the quality measurements of the wafer are used directly to adjust the processing parameters of the same wafer, the second aspect considers a situation, where this is not possible. In case the metrology tool performs the measurement after the wafer has been processed, the measurement results can be fed back to the control unit of the processing tool, e.g. the lithography tool, which follows a CMP-step. The prerequisite according to this aspect therefore is that the knowledge of which compensation is necessary for which processing parameter for the adjustment has to be built up by the control unit priority. This is provided by the feedback mechanism of the metrology results. A following semiconductor device, e.g. wafer, which has experience the same preceding processing device as the current semiconductor device, or wafer, essentially is adjusted by input from the current, or preceding, respecting, wafer measurement results. As in the previous aspect, data from just the preceding semiconductor device or accumulated data can be used to adjust the processing parameters of wafers, all having experienced the same preceding processing device.

In a further aspect, the control unit calculates the new set of values for adjusting the processing parameters combining the metrology measurement results and the tag of a semiconductor wafer. In a preferable embodiment, a database matrix is set up in which for each processing device the resulting quality measurement results are noticed, and from which by setting up a system of rules or formulas, a conversion from measurement results into processing parameter adjustments or compensations can be calculated. Each new semiconductor device quality measurement is attached to this database matrix for both aspects of feed-forward or feed-back methods.

According to one aspect, simple fuzzy logic rules can be set up to hold the system and do the calculation as straight forward as possible and allow an improvement of the rules on a day-to-day basis. If e.g. it is found that substantially one processing parameter is related to substantially one metrology parameter, i.e. measurement parameter, engineers may adapt the relation according to the most recent results or findings.

In another aspect, a more sophisticated relationship between measurement results and processing parameters can be set up by establishing a neural network. The control unit then contains an essentially self-learning system that is improved with each new quality measurement input.

The database, or database matrix, at least needs the information of the individual semiconductor device identification, the processing device number, and the adjusted values of the set of processing parameters, or alternatively the measurement results prior to being converted to adjusted values. In a further aspect, the semiconductor devices, in particular semiconductor wafers, are considered to be structured with minimum feature sizes of less than 0.14 μm. For these products, the statistical scatter measured in metrology tools have become particularly important. Therefore, the present method particularly improves the yield when manufacturing these products.

In a further aspect, the processing devices used in the preceding step are considered to be processing tools, e.g. CMP-apparatus, lithography tools, etc. or are considered to be processing chambers of one or more of the processing tools, since also chamber-to-chamber variations have been observed by the inventors, or processing heads for holding a semiconductor device in a processing tool like CMP-heads, etching wafer chucks, hot or cool plates, coater chucks, etc.

Also for the latter devices, head-to-head variations resulting in differing metrology parameters have been observed and can advantageously according to the present invention be compensated by adjusting the processing parameters of each wafer individually.

Other features which are considered as characteristic for the invention are set forth in the appended claims.

Although the invention is illustrated and described herein as embodied in a method for adjusting processing parameters of at least one plate-shaped object in a processing tool, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
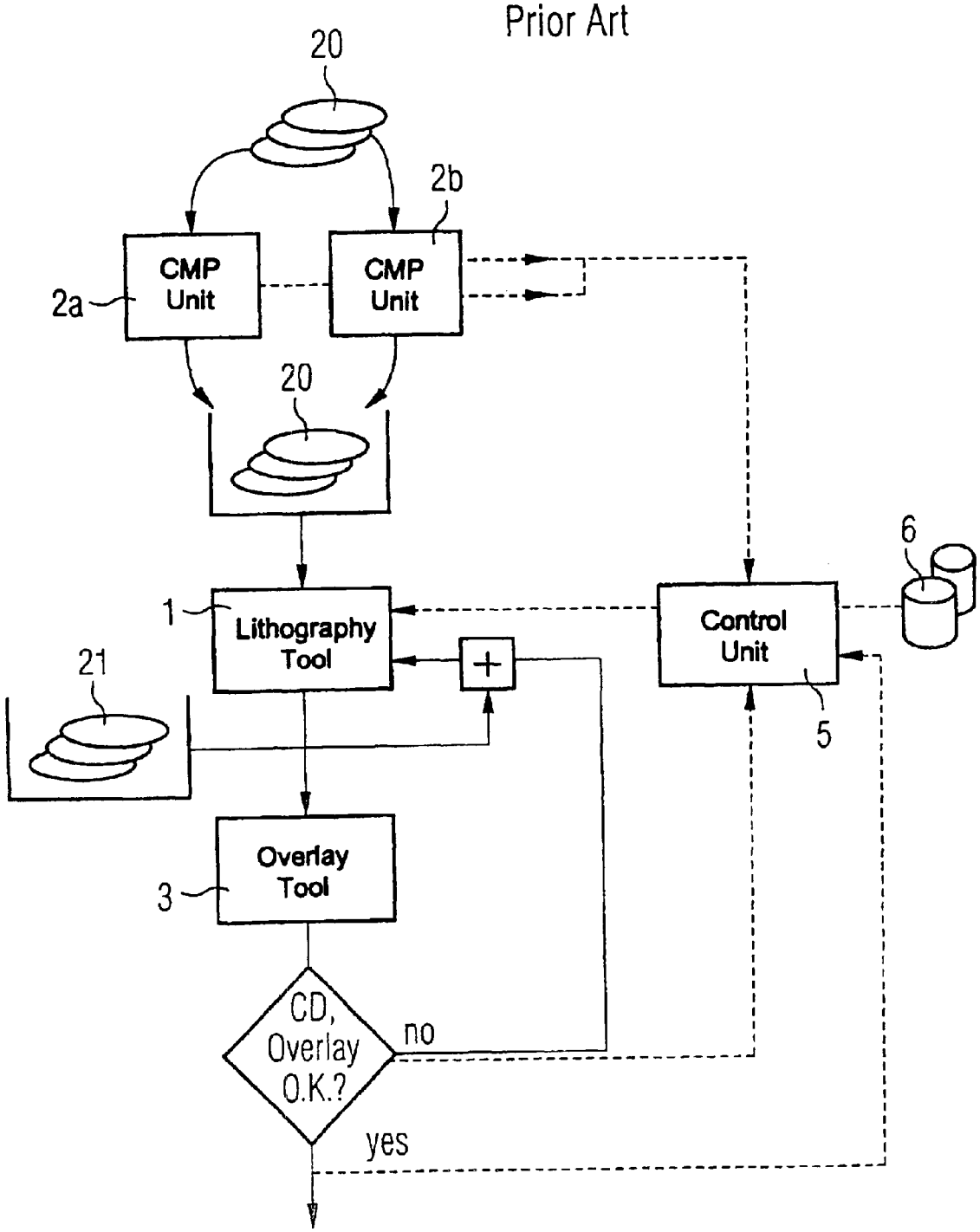
FIG. 1 is a block flow diagram showing a method for adjusting processing parameters according to prior art.

Referring now to the figures of the drawing in detail and first, particularly, to FIG. 1 thereof, there is shown a method of adjusting processing parameters of a lithographic tool as an example of the prior art. A section of a sequence of processing steps for manufacturing a semiconductor wafer schematically contains a group of CMP-units 2a, 2b followed by the lithographic tool 1, which is followed by an overlay tool 3. The lithography tool 1 is controlled by a control unit 5 to which attached is a database 6.

A lot of semiconductor wafers 20 is input to the CMP-units 2a, 2b for processing. The lot of wafers 20 is combined into a semiconductor wafer carrier. After polishing the semiconductor wafers 20 are loaded back into the device carrier and transferred to the lithography tool 1. From earlier processed wafer lots, the control unit 5 gained information, stored in a database 6, on how to adjust the lithography exposure dose parameters, focus channel parameters, and alignment parameters in order to retrieve the highest lithography step yield with respect to critical dimension and to overlay specifications. Implicitly, the control unit 5 compensates for an average offset of all CMP-units present and actively processing in the fab.

After carrying out the lithography step, the wafers are transferred to the overlay tool 3 which performs the critical dimension and overlay measurement. If the wafers 20 pass the metrology examination, they are moved forward for further processing. If the wafers 20 fail to lie within specifications, they are moved into rework into the lithography tool 1. The corresponding measurement results in any case are sent to the control unit 5 in order to improve the databases on which an adjustment is decided.

In order to try out a reasonable guess for the processing parameters, test wafers 21 are added and processed first in the lithography tool 1. In the overlay tool 3 they are then examined in order to verify the correctness of the process parameter guess. Eventually, the guess that was successful and the whole lot of wafers 20 is processed with these parameters irrespective of the CMP-unit used before. Probably, some wafers 20 still fail to pass the overlay control test. The success of the current set of processing parameters is noted in the control unit 5.

Figure 2:
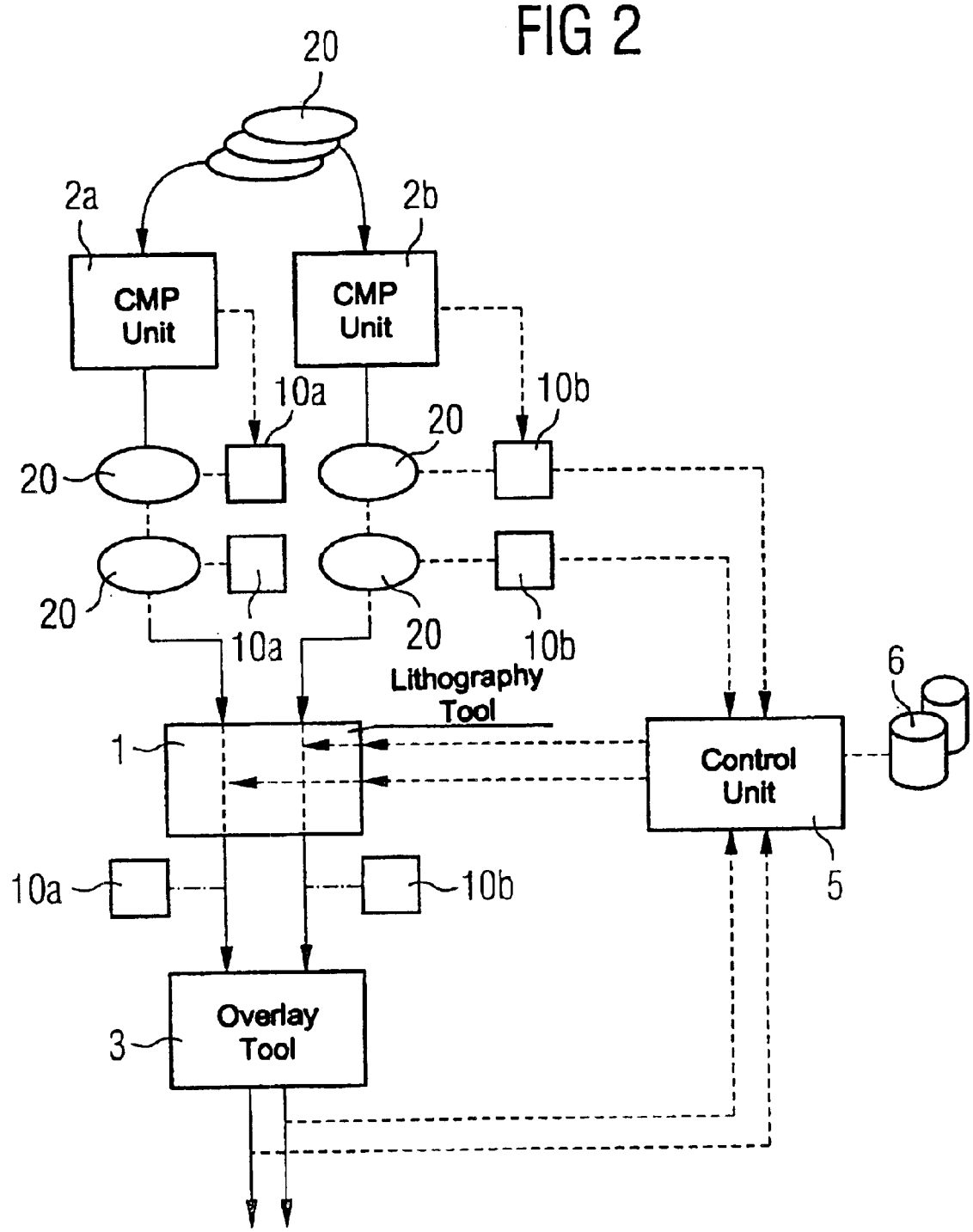
FIG. 2 is a block flow diagram showing an embodiment for adjusting processing parameters in a lithographic tool by feeding back metrology measurement results according to the invention.

A first embodiment according to the method of the present invention revealing the aspect of feeding back metrology measurements is shown in FIG. 2. The same sequence of processing steps and devices as shown in FIG. 1 are displayed.

After being processed in the CMP-unit 2a, 2b, the semiconductor wafers 20 of a lot are associated with a tag 10a, 10b each, generated and performed by a fabrication-wide CIM-system. The tag 10a, 10b is a data string containing a lot number, a slot number in the wafer carrier, and a processing device number. Occasionally wafers 20 are unloaded and loaded to a new carrier, a possible new slot number for a wafer is tracked and the tag is updated. The tag is then submitted to the control unit 5 of the lithography tool 1. The database 6 is made available to the control unit 5 containing information, i.e. a database matrix, of what compensation in terms of lithography parameter adjustment is necessary for a wafer 20 depending on which processing device (i.e. CMP-unit) 2a, 2b was used to polish the wafer 20.

Eventually, the wafers 20 are introduced to the lithography tool 1, and by unloading the wafers 20 from the carrier, the control unit 5 retrieves the wafer identification, i.e. the lot number and the slot number. The control unit 5 evaluates the corresponding tag 10a, 10b, which also has been stored in a database table, and thereby retrieves the CMP-unit 2a, 2b used for processing the wafer. The control unit 5 then adjusts the lithography tool parameter settings of alignment, exposure dose, and focus channel in order to compensate for the individual CMP-tool-offsets or variations.

After the lithography step, the semiconductor wafers 20 are transferred to the overlay tool 3, which performs the overlay and critical dimension measurement. Due to the compensation improvement, re-work is strongly reduced and is contributed to unexpected events. These will be communicated to the control unit 5 and the database. This may result in an additional correction with a requirement for engineering analysis of result, or an action notification sent to an engineer requiring an action or a disposition.

According to FIG. 2, the overlay measurement is considered to be successful and the metrology measurement results are fed back to control unit 5 to be stored in the database 6. There, with the help of a neuronal network, a suitable relation is formed, and improved between the compensational adjustment and the metrology measurement results. This relation can be established since the tags 10a, 10b remained active and were still known to overlay tool 3. The newly calculated CMP-unit dependent exposure parameter settings are then used for the next wafer lot as an input for the lithography tool 1.

Figure 3:
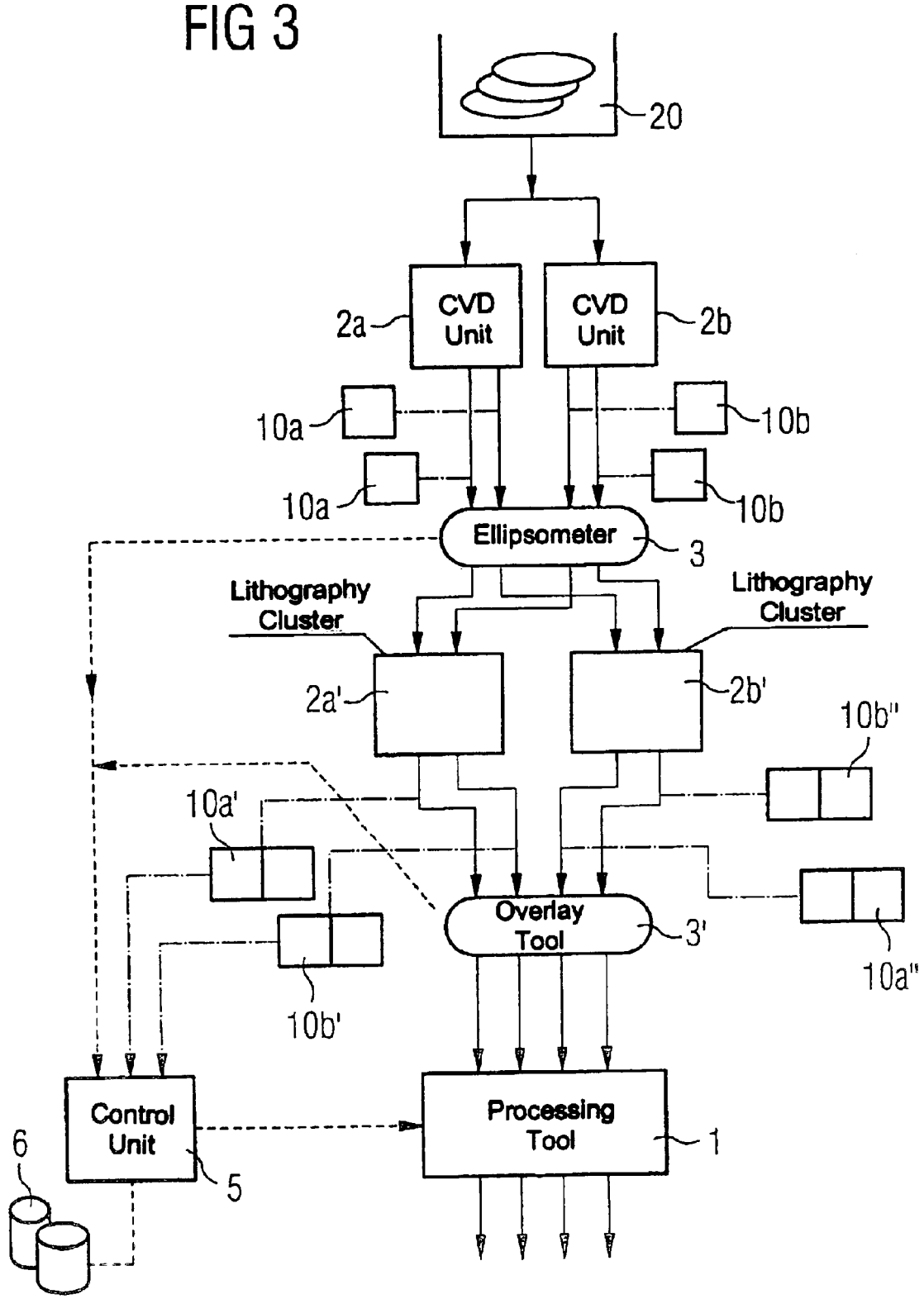
FIG. 3 is a block flow diagram showing an embodiment for adjusting the processing parameters of an etching tool by feeding forward metrology measurement results.

Another embodiment according to the method of the present invention revealing the feed-forward mechanism is shown in FIG. 3. The semiconductor wafers 20 are introduced to a deposition process in CVD-units 22a, 22b. The sequence is followed by a thickness measurement step in an ellipsometer 3 and—among other lithography steps—a developing step in lithography clusters 2a', 2b' being a combination of exposure tool and photoresist track. This is followed by a metrology step in the overlay tool 3. In an etching step, the processing parameters of the processing tool 11, i.e. an etching tool, are to be adjusted for each wafer, to compensate for variations from CVD-unit to CVD-unit and from developer cup to developer cup.

The lot is split onto a group of CVD-units 2a, 2b, and each wafer is supplied with the tags 10a, 10b, generated by the fab-wide CIM-system.

The thickness measurement results performed by the ellipsometer 33 are forwarded to the control unit 5, each result being connected to a wafer identification. The control unit 5 stores the results in the database matrix 6.

Meanwhile, the semiconductor wafers 20 have entered a group of lithographic clusters 2a', 2b' being split to be manufactured in parallel.

After being developed, each in one of the developer cups within the lithography clusters 2a', 2b', the processing device numbers corresponding to the lithography clusters, or developer cups, are added to the first tags 10a, 10b to give increased tags 10a', 10b', 10a", 10b". The tags now contain the wafer identification, the CVD-unit number, and the developer cup number. The wafer identification contains the lot number or the carrier number, and the slot number in which the corresponding wafer resides.

A critical dimension measurement in overlay tool 3 is then performed and the measurement results are submitted to the control unit 5. Eventually, the semiconductor wafers 20 are introduced to the etching tool 11.

The database 6 now contains the following table:

| Wafer: | 1 | 2 | 3 | 4 | ... | 25 |
|---|---|---|---|---|---|---|
| CVD unit: | A | B | A | B | ... | B |
| developer cup: | 1 | 1 | 2 | 1 | ... | 2 |
| etch tool: | X | X | X | X | X | X |

The CVD-units or chambers employed here are named "A", "B", and the developer cups are numbered "1", "2". There is just one etching tool named "X".

The CVD-unit and the developer cup have daily checks performed to give default values of all devices. Tool-offset values reflecting the compensation necessary to perform, are then:

A=thickness daily check+5 nm

B=thickness daily check−2 nm

1=CD daily check+9 nm

2=CD daily check+3 nm.

The process parameter to be determined and adjusted in the etching tool 1 is the etch time. A rule is set up with X=f(CVD-unit, developer cup).

The function f is periodically improved by fuzzy logic. For each wafer introduced to the etching tool 1, the wafer identification, i.e. slot number and lot number, are read out by the control unit 5 and the database entries in the above table are then used in combination with the formula for the etch time to adjust the etch time for each wafer individually. Since all quality measurement results are fed to the control unit 5 forwardly, even individual wafer effects in the processing devices can be compensated by the adjustment. The yield is advantageously improved and the quality enhanced.

We claim:

1. A method for adjusting process parameters for at least one plate-shaped object in a processing tool, the plate-shaped object having experienced at least one preceding processing step performed by one processing device out of at least one set of processing devices, an adjustment in the processing tool being controlled by a control unit, which comprises the steps of:

providing the plate-shaped object to the processing device;

processing the plate-shaped object;

generating a tag associated with the plate-shape object and representing a processing parameter offset of the processing device used in the processing step;

transferring the tag to the control unit;

transferring the plate-shaped object to a metrology tool;

performing at least one measurement selected from the group consisting of a critical dimension measurement and an overlay measurement;

forwarding metrology results of the measurement to the control unit;

transferring the plate-shaped object to the processing tool;

calculating a new set of values of the process parameters in response to the metrology results and the tag;

adjusting the processing tool using the new set of values of the process parameters resulting in adjusted process parameters; and performing a process step on the plate-shaped object in the processing tool using the adjusted process parameters.

2. The method according to claim 1, which further comprises:
   adjusting a first plate-shaped object associated with a first tag with a first set of values of process parameters; and
   adjusting a second plate-shaped object associated with a second tag with a second set of values of process parameters, the second set of values being different from the first set of values.

3. The method according to claim 1, which further comprises:
   providing a semiconductor wafer as the plate-shaped object;
   providing a lithographic tool as the processing tool; and
   performing the processing step as at least one of a chemical mechanical polishing step, an etching step, a chemical vapor deposition step, a diffusion step, a wet processing step, and a thin film deposition step.

4. The method according to claim 3, which further comprises setting the process parameters to be adjusted for the semiconductor wafer previously processed in the processing device to be at least one of an exposure dose, alignment settings, and focus channels of a lithographic tool.

5. The method according to claim 3, which further comprises structuring patterns on a surface layer of the plate-shaped object having a minimum resolution width of less than 0.25 $\mu$m.

6. The method according to claim 1, which further comprises performing the calculating step using fuzzy logic rules.

7. The method according to claim 1, which further comprises performing the calculating step using a neuronal network.

8. The method according to claim 1, which further comprises:
   storing, using the control unit, the adjusted process parameters as an entry in a database, the database containing for each plate-shaped object at least an individual plate-shaped object identification, a processing device number, and adjusted values of the set of process parameters; and
   performing the calculating step, in the control unit, from information stored in the database.

9. The method according to claim 1, which further comprises selecting the processing devices from the group consisting of processing tools, processing chambers of a processing tool, and processing heads for holding the plate-shaped object in the processing tool.

* * * * *